United States Patent
Krishna

(10) Patent No.: US 8,456,337 B1
(45) Date of Patent: Jun. 4, 2013

(54) SYSTEM TO INTERFACE ANALOG-TO-DIGITAL CONVERTERS TO INPUTS WITH ARBITRARY COMMON-MODES

(75) Inventor: Siddhartha Gopal Krishna, New Delhi (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/442,873

(22) Filed: Apr. 10, 2012

(51) Int. Cl.
*H03M 1/00* (2006.01)

(52) U.S. Cl.
USPC ........... 341/139; 361/111; 360/260; 360/291; 360/51; 360/69; 360/251; 327/53; 327/560; 327/337; 327/280; 330/253; 330/258; 330/261; 330/282

(58) Field of Classification Search
USPC .................. 341/139–155; 330/253, 258, 261, 330/282; 327/53, 280, 337, 560; 361/111; 360/9, 51, 69, 251–260, 291
See application file for complete search history.

(56) References Cited

U.S. PATENT DOCUMENTS

| | | | |
|---|---|---|---|
| 4,803,462 A | 2/1989 | Hester | |
| 5,831,562 A | 11/1998 | Van Auken | |
| 5,936,391 A * | 8/1999 | Larsen et al. | 323/313 |
| 6,696,890 B2 | 2/2004 | Hedberg | |
| 6,970,038 B2 * | 11/2005 | Chandrasekaran | 330/9 |
| 7,208,983 B2 * | 4/2007 | Imaizumi et al. | 327/94 |
| 7,345,530 B1 * | 3/2008 | Li et al. | 330/9 |
| 7,671,677 B2 * | 3/2010 | Kindt et al. | 330/258 |
| 7,683,716 B2 * | 3/2010 | Mehta et al. | 330/258 |
| 7,772,924 B2 * | 8/2010 | Matamura | 330/10 |
| 7,786,767 B2 | 8/2010 | Kushner | |
| 7,791,414 B1 * | 9/2010 | van Sprakelaar | 330/257 |
| 7,835,124 B2 * | 11/2010 | Siddhartha et al. | 361/91.1 |
| 2007/0163815 A1 | 7/2007 | Ungaretti | |

* cited by examiner

*Primary Examiner* — Lam T Mai
(74) *Attorney, Agent, or Firm* — Charles Bergere

(57) ABSTRACT

A system to interface analog-to-digital converters to inputs with arbitrary common-modes includes a common-mode voltage amplifier circuit and a PGA circuit connected to the common-mode voltage amplifier circuit. The common-mode voltage amplifier and PGA circuits receive first and second analog input signals. The PGA circuit eliminates the arbitrary common-modes from the first and second analog input signals based on an output of the common-mode voltage amplifier circuit.

20 Claims, 4 Drawing Sheets

SYSTEM TO INTERFACE ANALOG-TO-DIGITAL CONVERTERS TO INPUTS WITH ARBITRARY COMMON-MODES

BACKGROUND OF THE INVENTION

The present invention relates generally to analog-to-digital converters (ADCs) and, more particularly, to a system to interface ADCs to inputs with arbitrary common-modes.

Analog input signals are generated using various sources including analog sensors, analog measurement equipment, and the like. Many modern day applications require the analog sources to interface with digital circuits. For example, a computer application that displays the temperature of a microprocessor requires interfacing an analog temperature sensor with digital circuitry of the processor. Typically, analog and digital systems interface using ADCs. ADCs convert analog input signals such as those generated by temperature sensors to equivalent digital output signals, which can then be used by the digital circuitry for further processing.

Analog input signals may be fully-differential, single-ended, uni-polar, or varying common mode. It is necessary for analog signals to have a common-mode voltage that matches with a common-mode range of the ADC. A mismatch between the analog signal common-mode and the ADC common-mode range leads to sub-par performance of the ADC, and therefore should be avoided. Conventionally, a power gain amplifier (PGA) circuit is used to sample and hold and/or amplify the input signal and additional circuitry is used to eliminate the common-mode voltage in the analog input signals and generate analog output signals that are differential around the common-mode range of the ADC.

FIG. 1 is a schematic diagram of a conventional PGA circuit 100. The PGA circuit 100 includes first through fourth capacitors 102a-102d and an operational amplifier (op amp) 104.

A first terminal of the first capacitor 102a (having capacitance $C_S$) receives a first analog input signal (In$^+$) around arbitrary common-modes ($V_{icm}$) and the arbitrary common-modes by way of first and second switches ($S_1$ and $S_2$), respectively. The arbitrary common-modes ($V_{icm}$) are detected and applied using well known circuitry. A second terminal of the first capacitor 102a receives a common-mode voltage ($V_{cm}$) by way of a third switch ($S_3$). The arbitrary common-modes correspond to the common-mode voltage present in the first and second analog input signals and the common-mode voltage corresponds to a common-mode range of an ADC (not shown) to which the first and second output terminals are connected.

A first terminal of the second capacitor 102b (having capacitance $C_S$) receives a second analog input signal (In$^-$) around the arbitrary common-modes ($V_{icm}$) and the arbitrary common-modes by way of fifth and sixth switches ($S_5$ and $S_6$), respectively. A second terminal of the second capacitor 102b receives the common-mode voltage ($V_{cm}$) by way of a seventh switch ($S_7$).

The second terminals of the first and second capacitors 102a and 102b are connected to negative and positive input terminals of the op amp 104, by way of fourth and eighth switches ($S_4$ and $S_8$), respectively. The negative and positive input terminals of the op amp 104 are connected to first terminals of the third and fourth capacitors 102c and 102d (having capacitance $C_f$), respectively. Second terminals of the third and fourth capacitors 102c and 102d are connected to first and second output terminals of the op amp 104, respectively. The negative and positive input terminals of the op amp 104 are connected to the first and second output terminals of the op amp 104 by way of ninth and tenth switches ($S_9$ and $S_{10}$), respectively.

The PGA circuit 100 operates in first and second operating phases that correspond to sampling and signal amplification phases of the ADC. The switches $S_1$, $S_3$, $S_5$, $S_7$, $S_9$, and $S_{10}$ remain closed in the sampling phase and the first terminals of the first and second capacitors 102a and 102b receive the first and second analog input signals, respectively, and the second terminals of the first and second capacitors 102a and 102b receive the common-mode voltage. The negative and positive input terminals of the op amp 104 are connected to the first and second output terminals of the op amp 104 and the first and second terminals of the third and fourth capacitors 102c and 102d are shorted together. The first and second analog input signals and the common-mode voltage charge the first and second capacitors 102a and 102b in the sampling phase.

Theoretically, the charges on the first capacitor 102a ($Q_{Cs}^+$) and the third capacitor 102c ($Q_{Cf}^+$) are given by equations (1a) and (2a), $$Q_{Cs}^+ = (In^+ - V_{cm})*C_S = (V_{icm} + V_{id}/2 - V_{cm})*C_S \quad (1a)$$

$$Q_{Cf}^+ = 0 \quad (2a)$$

where,
In$^+$=first analog input signal;
$V_{cm}$=common-mode voltage;
$V_{icm}$=arbitrary common-modes;
$V_{id}$=input differential-mode voltage; and
$C_S$=capacitance of the first capacitor 102a and 102b.

At the end of the sampling phase, the switches $S_1$, $S_3$, $S_5$, $S_7$, $S_8$, and $S_{10}$ are opened and the signal amplification phase is initiated in which the switches $S_2$, $S_4$, $S_6$, and $S_8$ are closed. This causes the arbitrary common-modes ($V_{icm}$) to be provided to the first terminals of the first and second capacitors 102a and 102b. The second terminals of the first and second capacitors 102a and 102b are connected to the negative and positive input terminals of the op amp 104, respectively. The charges $Q_{Cs}^+$ and $Q_{Cf}^+$ are redistributed in the signal amplification phase, as given by equations (1b) and (2b), $$Q_{Cs}^+ = (V_{icm} - V_{cm})*C_S \quad (1b)$$

$$Q_{Cf}^+ = [(V_{icm} - V_{cm})*C_S - (V_{icm} + V_{id}/2 - V_{cm})*C_S]$$

$$Q_{Cf}^+ = V_{id}/2*C_S \quad (2b)$$

The first output terminal of the op amp 104 generates a first analog output signal that is given by equation (3a), $$V_o^+ = Q_{Cf}^+/C_f = (C_S/C_f)*V_{id}/2 \quad (3a)$$

Similarly, the second output terminal of the operational amplifier 104 generates a second analog output signal give by equation (3b), $$V_o^- = Q_{Cf}^-/C_f = (C_S/C_f)*(-V_{id}/2) \quad (3b)$$

Thus, $V_o(\text{diff}) = (V_o^+ - V_o^-) = (C_S/C_f)*V_{id} \quad (4)$

Equations (3a), (3b), and (4) show that arbitrary common-modes are eliminated from the first and second analog output signals $V_o^+$ and $V_o^-$.

To eliminate the arbitrary common-modes, the PGA circuit 100 requires input of the common-mode voltage and the arbitrary common-modes in the sampling and signal amplification phases, respectively. Conventionally, the arbitrary common-modes are generated using analog circuitry that needs to be precise and requires expensive electronic components with high fidelity and accuracy, which in turn increases the cost of the end-product. Additionally, the separate analog circuitry increases size and power-consumption of the end-product.

Therefore, it would be advantageous to have a circuit for generating arbitrary common-modes that is inexpensive, has low impact on size and power-consumption and overcomes the other above-mentioned limitations of conventional analog circuits.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
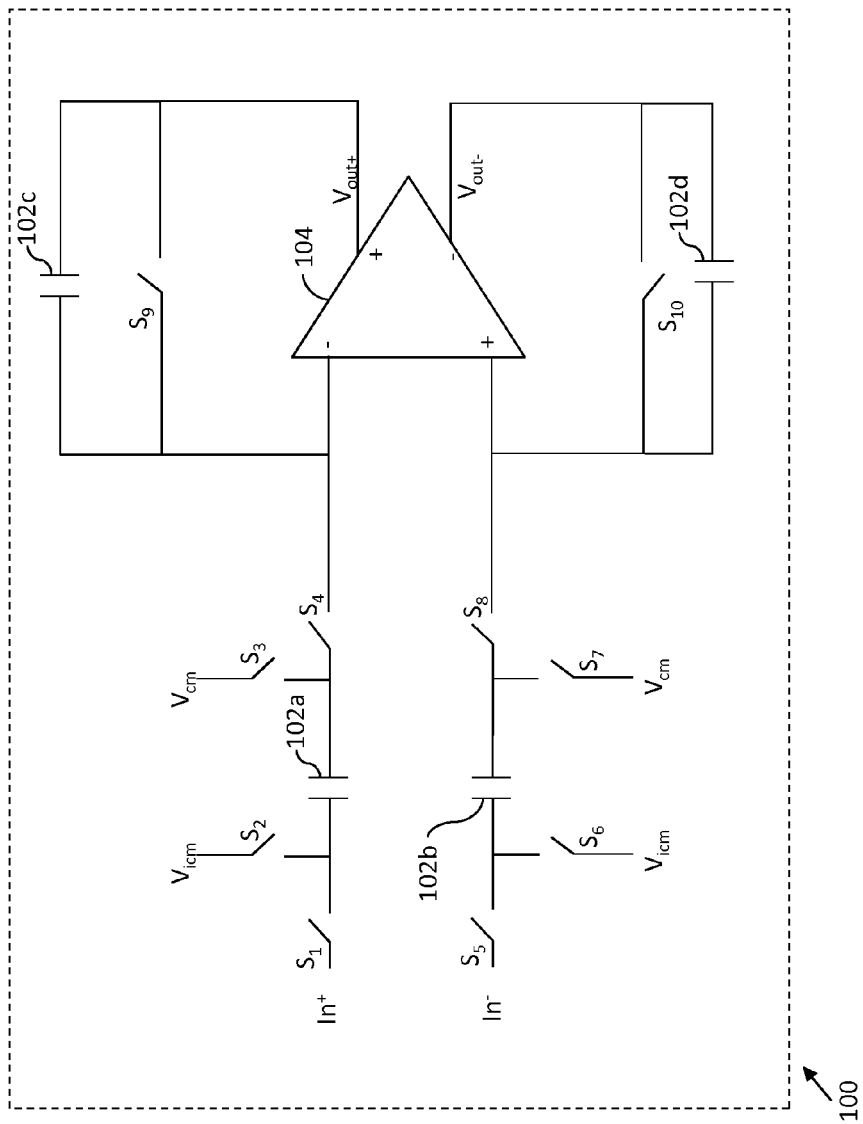
FIG. 1 is a schematic diagram of a conventional PGA circuit.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system to interface an analog-to-digital converter (ADC) to inputs with arbitrary common-modes is provided. The system includes a common-mode voltage amplifier circuit that includes a first capacitor having a first terminal that receives a first analog input signal by way of a first switch and a second terminal that receives an amplifier output voltage by way of a second switch. A second capacitor receives a second analog input signal at a first terminal thereof, by way of a third switch, and the amplifier output voltage at a second terminal thereof, by way of a fourth switch. A first operational amplifier receives a common-mode voltage at a positive terminal thereof, has a negative terminal that is connected to the second terminal of the first and second capacitors by way of fifth and sixth switches, respectively, and an output terminal for providing the amplifier output voltage based on the first and second analog input signals. The output terminal of the operation amplifier is connected to the negative terminal thereof, by way of a seventh switch, and to the first terminal of the first and second capacitors by way of eighth and ninth switches, respectively. The first operational amplifier provides the common-mode voltage in first and third operating phases, and the arbitrary common-modes in a second operating phase of the system, at the output terminal.

The system further includes a programmable gain amplifier (PGA) circuit, connected to the common-mode voltage amplifier circuit, that has a first input terminal connected to the output terminal of the first operational amplifier and a second input terminal that receives the first and second analog input signals. The PGA circuit eliminates the common modes from the first and second analog input signals to generate first and second analog output signals that are differential about the common-mode voltage.

In another embodiment of the present invention, a system for converting first and second analog input signals to a digital output signal is provided. The system includes a common-mode voltage amplifier circuit that includes a first capacitor having a first terminal that receives a first analog input signal by way of a first switch and a second terminal that receives an amplifier output voltage by way of a second switch. A second capacitor receives a second analog input signal at a first terminal thereof, by way of a third switch, and the amplifier output voltage at a second terminal thereof, by way of a fourth switch. A first operational amplifier receives a common-mode voltage at a positive terminal thereof, and further has a negative terminal that is connected to the second terminal of the first and second capacitors by way of fifth and sixth switches, respectively, and an output terminal for providing the amplifier output voltage based on the first and second analog input signals. The output terminal of the first operation amplifier is connected to the negative terminal thereof, by way of a seventh switch, and to the first terminal of the first and second capacitors by way of eighth and ninth switches, respectively. The first operational amplifier provides a common-mode voltage in first and third operating phases, and the arbitrary common-modes in a second operating phase, at the output terminal.

The system further includes a PGA circuit, connected to the common-mode voltage amplifier circuit, that has a first input terminal connected to the output terminal of the first operational amplifier and a second input terminal that receives the first and second analog input signals. The PGA circuit eliminates the common modes from the first and second analog input signals to generate first and second analog output signals that are differential about the common-mode voltage. An analog-to-digital converter (ADC) is connected to the PGA circuit for converting the first and second analog output signals to a digital output signal.

In yet another embodiment of the present invention, a system to interface an ADC to inputs with arbitrary common-modes is provided. The system includes a common-mode voltage amplifier circuit that includes a first capacitor having a first terminal that receives a first analog input signal by way of a first switch and a second terminal that receives an amplifier output voltage by way of a second switch. A second capacitor receives a second analog input signal at a first terminal thereof, by way of a third switch, and the amplifier output voltage at a second terminal thereof, by way of a fourth switch. A first operational amplifier receives a common-mode reference voltage at a positive terminal thereof, and has a negative terminal that is connected to the second terminal of the first and second capacitors by way of fifth and sixth switches, respectively, and an output terminal for providing the amplifier output voltage based on the first and second analog input signals. The output terminal of the first operation amplifier is connected to the negative terminal thereof, by way of a seventh switch, and to the first terminal of the first and second capacitors by way of eighth and ninth switches, respectively. The first operational amplifier provides a common-mode voltage in first and third operating phases, and the arbitrary common-modes in a second operating phase of the system, at the output terminal.

The system further includes a PGA circuit, connected to the common-mode voltage amplifier circuit, that has a first input terminal connected to the output terminal of the first operational amplifier and a second input terminal that receives the first and second analog input signals. The PGA circuit eliminates the common modes from the first and second analog input signals to generate first and second analog output signals that are differential about the common-mode voltage.

Various embodiments of the present invention provide a system to interface an ADC to inputs with arbitrary common-modes. A common-mode voltage amplifier circuit and a PGA circuit are provided with first and second analog input signals. The common-mode voltage amplifier circuit operates in first, second, and third operating phases that correspond to sampling, signal amplification, and analog-to-digital conversion phases of the ADC. The common-mode voltage amplifier circuit generates a common-mode voltage in the sampling and analog-to-digital conversion phases and arbitrary common-modes in the signal amplification phase. The output of the common-mode voltage amplifier circuit is provided to the PGA circuit in the sampling and signal amplification phases and to an ADC in the analog-to-digital conversion phase. The PGA circuit eliminates the arbitrary common-modes from the first and second analog input signals and generates first and second analog output signals that are differential about the common-mode voltage. Thereafter, the first and second analog output signals are provided to the ADC that converts them to a digital output signal. The PGA circuit modifies the first and second analog input signals, such that they are compatible for the ADC using the common-mode voltage and the arbitrary common-modes generated by the common-mode voltage amplifier circuit and eliminates the need for a separate analog circuitry for generating arbitrary common-modes. The common-mode voltage amplifier circuit is modified to generate the arbitrary common-modes used by the PGA circuit. Since the extra components, viz., a pair of capacitors, an imprecise amplifier, and a few switches, required to modify the common-mode voltage amplifier circuit are inexpensive, the cost of the ADC system is quite low when compared to conventional systems. Moreover, due to the absence of a noise/linearity requirement, the capacitors have smaller sizes and cause less impact on the size and power-consumption of the ADC system.

Figure 2:
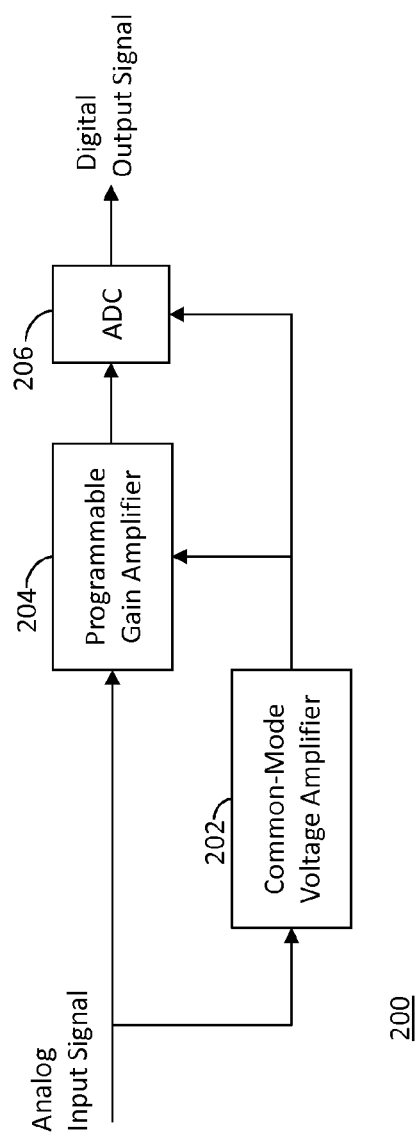
FIG. 2 is a schematic diagram of a system for converting an analog input signal with arbitrary common-modes to a digital output signal in accordance with an embodiment of the present invention.

Referring now to FIG. 2, a schematic diagram illustrating a system 200 for converting an analog input signal with arbitrary common-modes to a digital output signal, in accordance with an embodiment of the present invention, is shown. The system 200 includes a common-mode voltage amplifier circuit 202, a PGA circuit 204, and an ADC 206.

The analog input signal is provided to the common-mode voltage amplifier circuit 202 and the PGA circuit 204. The common-mode voltage amplifier circuit 202 generates an amplifier output voltage that is equal to a common-mode voltage in first and third operating phases and arbitrary common-modes in a second operating phase of the system 200. The first, second, and third operating phases correspond to sampling, signal amplification, and analog-to-digital conversion phases, respectively, of the system 200. The common-mode voltage amplifier circuit 202 provides the common-mode voltage and arbitrary common-modes to the PGA circuit 204 in the sampling and signal amplification phases, respectively. Additionally, the common-mode voltage amplifier circuit 202 provides the common-mode voltage to the ADC 206 in the analog-to-digital conversion phase.

The PGA circuit 204 uses the amplifier output voltage to eliminate the arbitrary common-modes from the analog input signal and generate an analog output signal that is differential around the common-mode voltage and compatible with the ADC 206. The PGA circuit 204 provides the analog output signal to the ADC 206, which converts it to the digital output signal.

Figure 3:
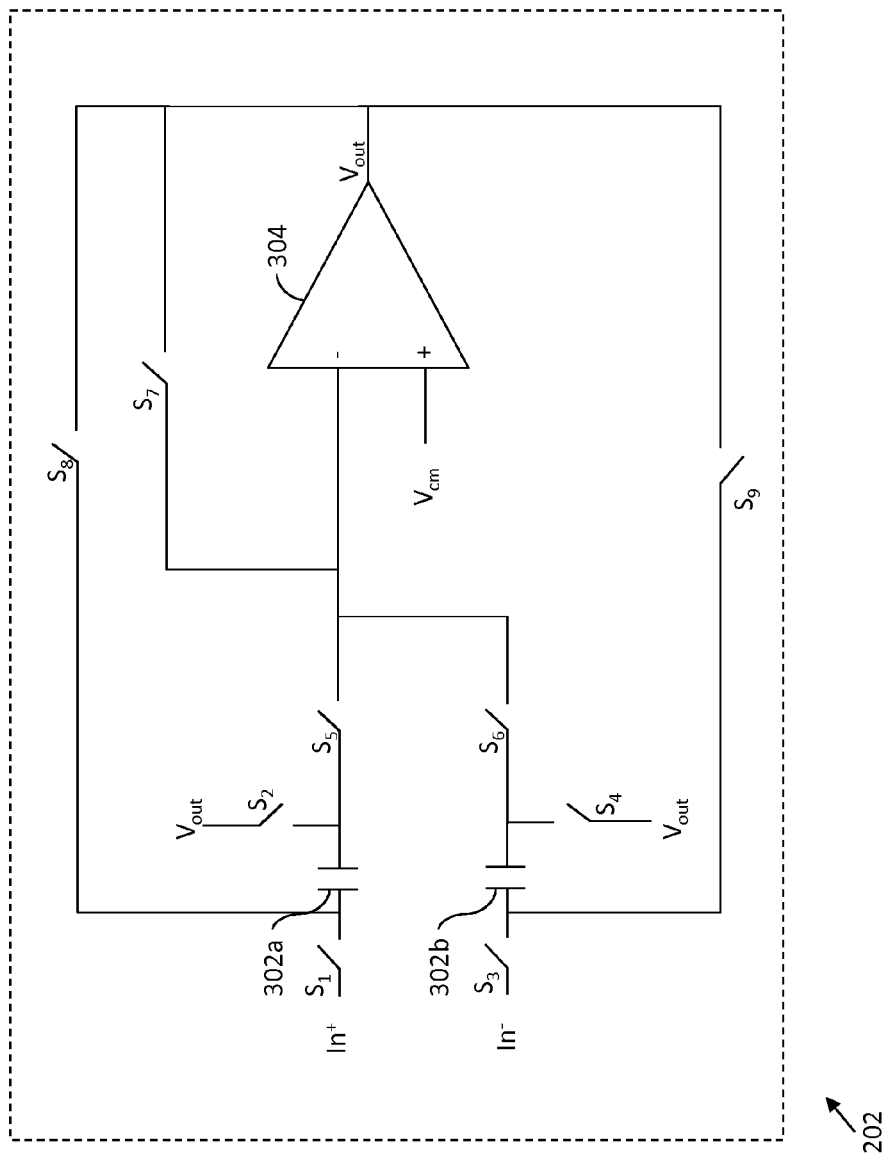
FIG. 3 is a schematic diagram of a common-mode voltage amplifier circuit in accordance with an embodiment of the present invention.

Referring now to FIG. 3, a schematic diagram illustrating the common-mode voltage amplifier circuit 202 in detail, in accordance with an embodiment of the present invention, is shown. The common-mode voltage amplifier circuit 202 includes first and second capacitors 302a and 302b, and an operational amplifier 304.

A first terminal of the first capacitor 302a (having capacitance C) is connected to an output terminal of the operational amplifier 304 by way of an eighth switch ($S_8$) and receives a first analog input signal ($In^+$) by way of a first switch ($S_1$). Further, a first terminal of the second capacitor 302b (having capacitance C) is connected to the output terminal of the operational amplifier 304 by way of a ninth switch ($S_9$) and receives a second analog input signal ($In^-$) by way of a third switch ($S_3$).

A second terminal of the first and second capacitors 302a and 302b is connected to a negative terminal of the operational amplifier 304, by way of fifth and sixth switches ($S_5$ and $S_6$). Additionally, the second terminal of the first and second capacitors 302a and 302b is connected to the output terminal of the operational amplifier 304 by way of second and fourth switches ($S_2$ and $S_4$), respectively. Further, the negative terminal of the operational amplifier 304 is connected to the output terminal thereof, by way of a seventh switch ($S_7$). A positive terminal of the operational amplifier 304 receives a common-mode reference voltage having a magnitude equal to the common-mode voltage. In an embodiment of the present invention, the common-mode reference voltage may be generated by a reference voltage generation circuit (not shown) and is within the common-mode range of the ADC 206 (refer to FIG. 2).

In the sampling phase, the switches $S_1$, $S_2$, $S_3$, $S_4$, and $S_7$ are closed and the first and second analog input signals are provided to the first terminal of the first and second capacitors 302a and 302b, respectively. The second terminal of the first and second capacitors 302a and 302b receive an amplifier output voltage generated by the operational amplifier 304 that is connected in a negative feedback loop configuration. During the sampling phase a magnitude of the amplifier output voltage is equal to the common-mode voltage.

The first and second analog input signals and the common-mode voltage charge the first and second capacitors 302a and 302b. Theoretically, the charges on the first and second capacitors 302a and 302b, $Q_C^+$ and $Q_C^-$, are given by equations (5a) and (5b), $$Q_C^+ = (In^+ - V_{out})*C \rightarrow (V_{icm} + V_{id}/2 - V_{out})*C \qquad (5a)$$

$$Q_C^- = (In^- - V_{out})*C \rightarrow (V_{icm} - V_{id}/2 - V_{out})*C \qquad (5b)$$

where,
$In^+$=first analog input signal;
$In^-$=second analog input signal;
$V_{out}$=output of operational amplifier;
$V_{icm}$=arbitrary common-modes;
$V_{id}$=differential-mode voltage; and
C=capacitance of each first and second capacitors 302a and 302b.

The negative feedback loop configuration of the operational amplifier 304 causes the common-mode reference voltage to be provided at the negative terminal of the operational amplifier 304 and appears at the output terminal thereof and is given by equation (6), $$V_{out} = V_{cm} \quad (6)$$

The common-mode voltage generated by the operational amplifier 304 is provided to the PGA circuit 204 (refer to FIG. 2) in the sampling phase.

At the end of the sampling phase, the switches $S_1$, $S_2$, $S_3$, $S_4$, and $S_7$ are opened and the signal amplification phase is initiated. At the beginning of the signal amplification phase, the switches $S_5$, $S_6$, $S_9$, and $S_9$ are closed which results in the first and second capacitors 302a and 302b to get connected in parallel between the negative and output terminals of the operational amplifier 304. The first and second capacitors 302a and 302b can be assumed to function as a single capacitor with capacitance 2C, i.e., sum of the capacitances of the first and second capacitors 302a and 302b. The charge and potential difference across this single capacitor in the signal amplification phase are theoretically given by equations (7a) and (7b), $$Q_{2C} = Q_C^+ + Q_C^-$$

From equations (5a) and (5b):

$$Q_{2C} \rightarrow (V_{icm} + V_{id}/2 - V_{out})*C + (V_{icm} - V_{id}/2 - V_{out})*C$$

From equation (6)

$$Q_{2C} \rightarrow (V_{icm} - V_{cm})*2C \quad (7a)$$

$$V_{2C} = (V_{icm} - V_{cm})*2C/2C \rightarrow (V_{icm} - V_{cm}) \quad (7b)$$

As the operational amplifier 304 is in a negative feedback loop configuration, the negative and positive terminals of the operational amplifier 304 are at same potential; therefore, the output terminal of the operational amplifier 304 generates the arbitrary common-modes, given below by equation (8), $$V_{out} = V^- + V_{2C}$$

$$V_{out} \rightarrow V_{cm} + V_{icm} - V_{cm}$$

$$V_{out} \rightarrow V_{icm} \quad (8)$$

The amplifier output voltage, i.e., the arbitrary common-modes, generated by the operational amplifier 304 is provided to the PGA circuit 204 (refer to FIG. 2) in the signal amplification phase. A detailed explanation of the working of the PGA circuit 204 in the sampling and signal amplification phases using the amplifier output voltage is provided in conjunction with FIG. 5 below.

The analog-to-digital conversion phase begins after the completion of the signal amplification phase and the switches $S_5$, $S_6$, $S_8$, and $S_9$ are opened and the switches $S_1$, $S_2$, $S_3$, $S_4$, and $S_7$ are closed. The operation of the common-mode voltage amplifier circuit 202 in the analog-to-digital conversion phase is similar to that in the sampling phase in which the common-mode voltage amplifier circuit 202 generates the common-mode voltage as the amplifier output voltage. The common-mode voltage is provided to the ADC 206 (refer to FIG. 2). The ADC 206 uses the common-mode voltage for analog-to-digital conversion of an analog output signal to a digital output signal.

Figure 4:
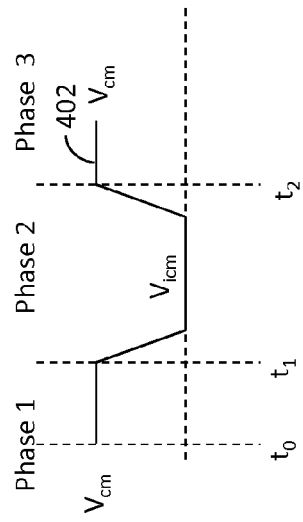
FIG. 4 illustrates an output waveform generated by the common-mode voltage amplifier circuit in accordance with an embodiment of the present invention.

FIG. 4 illustrates an output waveform 402 of the amplifier output voltage generated by the common-mode voltage amplifier circuit 202 (refer to FIGS. 2 and 3). A magnitude of the output waveform 402 varies according to an operating phase of the common-mode voltage amplifier circuit 202. As illustrated, from time $t_0$ to $t_1$, the magnitude of the output waveform 402 is equal to the common-mode voltage in the sampling phase. From time $t_1$ to $t_2$, the magnitude of the output waveform 402 equals the arbitrary common-modes in the signal amplification phase. Time $t_2$ onwards (till a subsequent ADC cycle that includes the first, second, third operating phases), the magnitude of the output waveform 402 is equal to the common-mode voltage in the analog-to-digital conversion phase.

Figure 5:
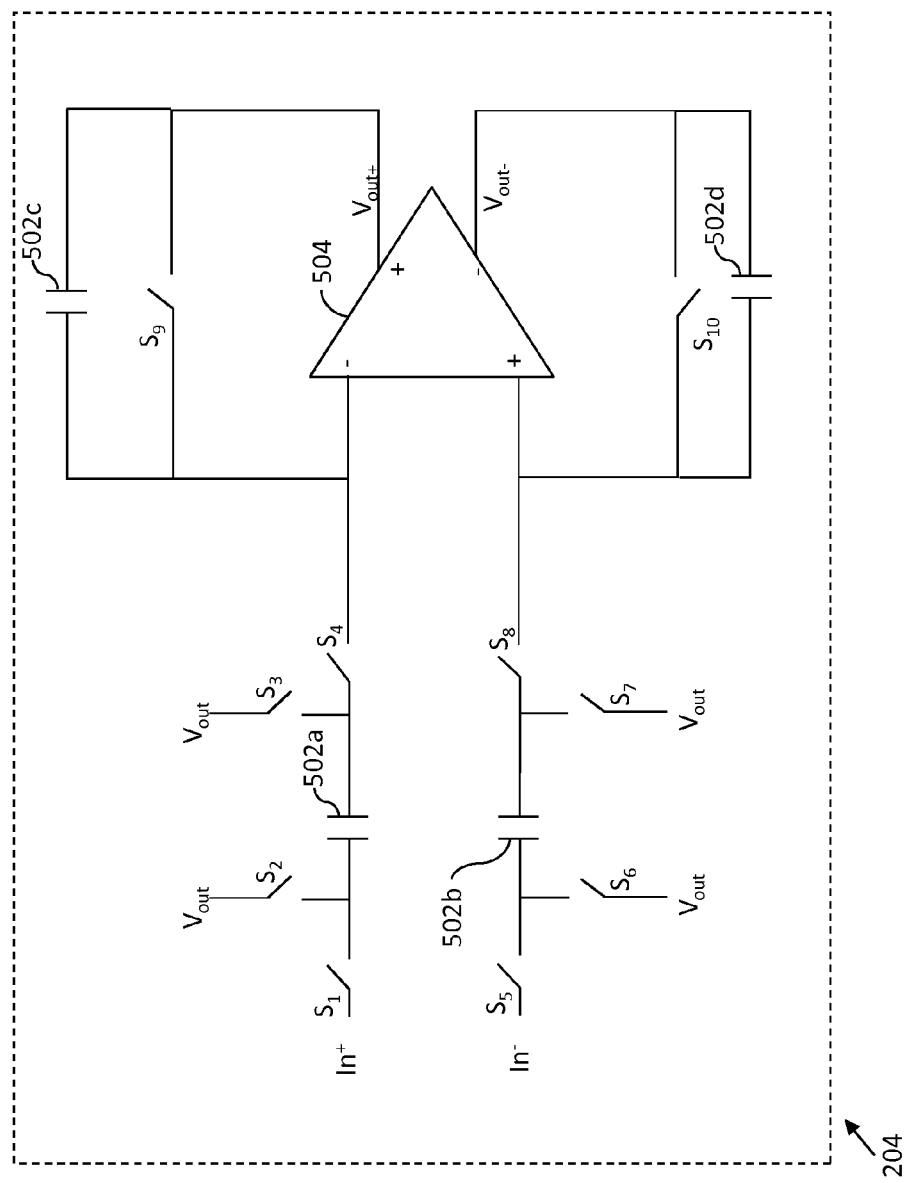
FIG. 5 is a schematic diagram of a PGA circuit in accordance with an embodiment of the present invention.

Referring now to FIG. 5, a schematic diagram of the PGA circuit 204, in accordance with an embodiment of the present invention, is shown. The PGA circuit 204 includes first through fourth capacitors 502a-502d, and an operational amplifier 504.

A first terminal of the first capacitor 502a (having capacitance $C_S$) receives a first analog input signal (In$^+$) and an output of the common-mode voltage amplifier circuit 202 (refer to FIGS. 2 and 3), i.e., an amplifier output voltage, by way of first and second switches ($S_1$ and $S_2$), respectively. A second terminal of the first capacitor 502a receives the amplifier output voltage by way of a third switch ($S_3$). A first terminal of the second capacitor 502b (having capacitance $C_S$) receives a second analog input signal (In$^-$) and the amplifier output voltage by way of fifth and sixth switches ($S_5$ and $S_6$), respectively. A second terminal of the second capacitor 502b receives the amplifier output voltage by way of a seventh switch ($S_7$).

The second terminal of the first and second capacitors 502a and 502b is connected to negative and positive input terminals of the operational amplifier 504, by way of fourth and eighth switches ($S_4$ and $S_8$), respectively. The negative and positive input terminals of the operational amplifier 504 are connected to first terminal of the third and fourth capacitors 502c and 502d (having capacitance $C_f$), respectively. A second terminal of the third and fourth capacitors 502c and 502d is connected to first and second output terminals of the operational amplifier 504, respectively. The negative and positive input terminals of the operational amplifier 504 are connected to the first and second output terminals thereof, by way of ninth and tenth switches ($S_9$ and $S_{10}$), respectively.

The PGA circuit 204 operates in the sampling and signal amplification phases. In the sampling phase, the switches $S_1$, $S_3$, $S_5$, $S_7$, $S_9$ and $S_{10}$ are closed. As a result, the first terminal of the first and second capacitors 502a and 502b receives the first and second analog input signals and the second terminal thereof receives the amplifier output voltage, i.e., a common-mode voltage. Further, the first and second terminals of the third and fourth capacitors 502c and 502d are shorted together. The first and second analog input signals and the common-mode voltage charge the first and second capacitors 502a and 502b in the sampling phase. Charges on the first and third capacitors 502a and 502c, $Q_{Cs}^+$ and $Q_{Cf}^+$, in the sampling phase, are theoretically given by equations (9a) and (9b), $$Q_{Cs}^+ = (In^+ - V_{cm})*C_S$$

$$Q_{Cs}^+ \rightarrow (V_{icm} + V_{id}/2 - V_{cm})*C_S \quad (9a)$$

$$Q_{Cf}^+ = 0 \quad (9b)$$

where,

In$^+$=first analog input signal;
$V_{cm}$=common-mode voltage;
$V_{icm}$=arbitrary common-modes;
$V_{id}$=differential-mode voltage; and
$C_S$=capacitance of the first capacitor 502a.

At the end of the sampling phase, the switches $S_1$, $S_3$, $S_5$, $S_7$, $S_9$ and $S_{10}$ are opened. Thereafter, the signal amplification phase is initiated in which the switches $S_2$, $S_4$, $S_6$, and $S_8$ are closed and the amplifier output voltage, i.e., arbitrary common-modes, is provided to the first terminal of the first and second capacitors 502a and 502b and the second terminal of the first and second capacitors 502a and 502b is connected to the negative and positive input terminals of the operational amplifier 504, respectively. The charges $Q_{Cs}^+$ and $Q_{Cf}^+$ are redistributed in the signal amplification phase and are given by equations (10a) and (10b), $$Q_{Cs}^+ = (V_{icm} - V_{cm})^* C_S \quad (10a)$$

$$Q_{Cf}^+ = [(V_{icm} - V_{cm})^* C_S - (V_{icm} + V_{id}/2 - V_{cm})^* C_S]$$

$$Q_{Cf}^+ \rightarrow V_{id}/2 \, {}^* C_S \quad (10b)$$

Thus, a first analog output signal output by the first output terminal of the operational amplifier 504 is given by equation (11a), $$V_o^+ = Q_{Cf}^+ / C_f = (C_S/C_f)^* V_{id}/2 \quad (11a)$$

Similarly, a second analog output signal output by the second output terminal of the operational amplifier 504 is given by equation (11b), $$V_o^- = Q_{Cf}^- / C_f = (C_S/C_f)^* (-V_{id}/2) \quad (11b)$$

$$V_o(\text{diff}) = (V_o^+ - V_o^-) = (C_S/C_f)^* V_{id} \quad (12)$$

The equations (11a), (11b), and (12) show that the arbitrary common-modes ($V_{icm}$) are eliminated from the analog output signals $V_o^+$ and $V_o^-$. Therefore, the first and second analog output signals are modified to make them compatible for the ADC 206.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A system to interface an analog-to-digital converter (ADC) to inputs with arbitrary common-modes, comprising:
   a common-mode voltage amplifier circuit, including:
      a first capacitor having a first terminal that receives a first analog input signal by way of a first switch and a second terminal that receives an amplifier output voltage by way of a second switch;
      a second capacitor having a first terminal that receives a second analog input signal by way of a third switch, and a second terminal that receives the amplifier output voltage by way of a fourth switch; and
      a first operational amplifier having a positive terminal that receives a common-mode voltage, a negative terminal connected to the second terminal of the first and second capacitors by way of fifth and sixth switches, respectively, and an output terminal for providing the amplifier output voltage based on the first and second analog input signals, wherein the output terminal is connected to the negative terminal by way of a seventh switch and to the first terminal of the first and second capacitors by way of eighth and ninth switches, respectively, wherein the amplifier output voltage is equal to the common-mode voltage in first and third operating phases, and to the arbitrary common-modes in a second operating phase; and
   a programmable gain amplifier (PGA) circuit having a first input terminal connected to the output terminal of the first operational amplifier and a second input terminal that receives the first and second analog input signals, wherein the PGA circuit eliminates the arbitrary common-modes from the first and second analog input signals to generate first and second analog output signals that are differential about the common-mode voltage.

2. The system of claim 1, wherein the PGA circuit includes:
   a third capacitor having a first terminal that receives the first analog input signal by way of a tenth switch and the amplifier output voltage by way of an eleventh switch, and a second terminal that receives the amplifier output voltage by way of a twelfth switch;
   a fourth capacitor having a first terminal that receives the second analog input signal by way of a thirteenth switch and the amplifier output voltage by way of a fourteenth switch, and a second terminal that receives the amplifier output voltage by way of a fifteenth switch;
   a second operational amplifier having a positive input terminal connected to the second terminal of the fourth capacitor by way of a sixteenth switch, a negative input terminal connected to the second terminal of the third capacitor by way of a seventeenth switch, a first output terminal connected to the negative input terminal by way of an eighteenth switch, and a second output terminal connected to the positive input terminal by way of a nineteenth switch, wherein the second operational amplifier provides the first and second analog output signals at the first and second output terminals, respectively, in the second operating phase;
   a fifth capacitor having a first terminal connected to the negative input terminal of the second operational amplifier, and a second terminal connected to the first output terminal of the second operational amplifier; and
   a sixth capacitor having a first terminal connected to the positive input terminal of the second operational amplifier, and a second terminal connected to the second output terminal of the second operational amplifier.

3. The system of claim 2, wherein the first, second, third, fourth, and seventh switches are switched ON in the first and third operating phases, and the fifth, sixth, eighth, and ninth switches are switched ON in the second operating phase.

4. The system of claim 3, wherein the tenth, twelfth, thirteenth, fifteenth, eighteenth, and nineteenth switches are switched ON in the first operating phase, and the eleventh, fourteenth, sixteenth, and seventeenth switches are switched ON in the second operating phase.

5. The system of claim 1, wherein the ADC is connected to the PGA circuit.

6. The system of claim 5, wherein the ADC converts the first and second analog output signals differential around the common-mode voltage to a digital output signal.

7. The system of claim 5, wherein the first operating phase corresponds to a sampling phase of the ADC, the second operating phase corresponds to a signal amplification phase of the PGA circuit, and the third operating phase corresponds to an analog-to-digital conversion phase of the ADC.

8. The system of claim 1, wherein the first and second analog input signals comprise at least one of fully-differential, single-ended, uni-polar, and varying common-mode signals.

9. A system for converting first and second analog input signals to a digital output signal, comprising:
   a common-mode voltage amplifier circuit, including:
      a first capacitor having a first terminal that receives a first analog input signal by way of a first switch and a second terminal that receives an amplifier output voltage by way of a second switch;
      a second capacitor having a first terminal that receives a second analog input signal by way of a third switch, and a second terminal that receives the amplifier output voltage by way of a fourth switch; and a first operational amplifier having a positive terminal that receives a common-mode voltage, a negative terminal connected to the second terminal of the first and second capacitors by way of fifth and sixth switches, respectively, and an output terminal for providing the amplifier output voltage based on the first and second analog input signals, wherein the output terminal is connected to the negative terminal by way of a seventh switch and to the first terminal of the first and second capacitors by way of eighth and ninth switches, respectively, wherein the amplifier output voltage is equal to the common-mode voltage in first and third operating phases, and to the arbitrary common-modes in a second operating phase;

a programmable gain amplifier (PGA) circuit having a first input terminal connected to the output terminal of the first operational amplifier and a second input terminal that receives the first and second analog input signals, wherein the PGA circuit eliminates the arbitrary common-modes from the first and second analog input signals to generate first and second analog output signals that are differential about the common-mode voltage; and an analog-to-digital converter (ADC), connected to the PGA circuit, for converting the first and second analog output signals differential around the common-mode voltage, to the digital output signal.

10. The system of claim 9, wherein the PGA circuit includes:

a third capacitor having a first terminal that receives the first analog input signal by way of a tenth switch and receives the amplifier output voltage by way of an eleventh switch, and a second terminal that receives the amplifier output voltage by way of a twelfth switch;

a fourth capacitor having a first terminal that receives the second analog input signal by way of a thirteenth switch and receives the amplifier output voltage by way of a fourteenth switch, and a second terminal that receives the amplifier output voltage by way of a fifteenth switch;

a second operational amplifier having a positive input terminal connected to the second terminal of the fourth capacitor by way of a sixteenth switch, a negative input terminal connected to the second terminal of the third capacitor by way of a seventeenth switch, a first output terminal that is connected to the negative input terminal by way of an eighteenth switch, and a second output terminal that is connected to the positive input terminal by way of a nineteenth switch, wherein the second operational amplifier provides the first and second analog output signals at the first and second output terminals, respectively, in the second operating phase;

a fifth capacitor having a first terminal connected to the negative input terminal of the second operational amplifier, and a second terminal connected to the first output terminal of the second operational amplifier; and a sixth capacitor having a first terminal connected to the positive input terminal of the second operational amplifier, and a second terminal connected to the second output terminal of the second operational amplifier.

11. The system of claim 10, wherein the first, second, third, fourth, and seventh switches are switched on in the first and third operating phases, and the fifth, sixth, eighth, and ninth switches are switched on in the second operating phase.

12. The system of claim 11, wherein the tenth, twelfth, thirteenth, fifteenth, eighteenth, and nineteenth switches are switched on in the first operating phase, and the eleventh, fourteenth, sixteenth, and seventeenth switches are switched on in the second operating phase.

13. The system of claim 9, wherein the first operating phase corresponds to a sampling phase of the ADC, the second operating phase corresponds to a signal amplification phase of the PGA circuit, and the third operating phase corresponds to an analog-to-digital conversion phase of the ADC.

14. The system of claim 9, wherein the first and second analog input signals comprise at least one of fully-differential, single-ended, uni-polar, and varying common-mode signals.

15. A system to interface an analog-to-digital converter (ADC) to inputs with arbitrary common-modes, comprising:

a common-mode voltage amplifier circuit, including:

a first capacitor having a first terminal that receives a first analog input signal by way of a first switch and a second terminal that receives an amplifier output voltage by way of a second switch;

a second capacitor having a first terminal that receives a second analog input signal by way of a third switch, and a second terminal that receives the amplifier output voltage by way of a fourth switch; and a first operational amplifier having a positive terminal that receives a common-mode reference voltage, a negative terminal connected to the second terminal of the first and second capacitors by way of fifth and sixth switches, respectively, and an output terminal for providing the amplifier output voltage based on the first and second analog input signals, wherein the output terminal is connected to the negative terminal by way of a seventh switch and to the first terminal of the first and second capacitors by way of eighth and ninth switches, respectively, wherein the amplifier output voltage is equal to a common-mode voltage in first and third operating phases, and to the arbitrary common-modes in a second operating phase of the system; and a programmable gain amplifier (PGA) circuit having a first input terminal connected to the output terminal of the first operational amplifier and a second input terminal that receives the first and second analog input signals, wherein the PGA circuit eliminates the arbitrary common-modes from the first and second analog input signals to generate first and second analog output signals that are differential about the common-mode voltage.

16. The system of claim 15, wherein the PGA circuit includes:

a third capacitor having a first terminal that receives the first analog input signal by way of a tenth switch and the amplifier output voltage by way of an eleventh switch, and a second terminal that receives the amplifier output voltage by way of a twelfth switch;

a fourth capacitor having a first terminal that receives the second analog input signal by way of a thirteenth switch and the amplifier output voltage by way of a fourteenth switch, and a second terminal that receives the amplifier output voltage by way of a fifteenth switch;

a second operational amplifier having a positive input terminal connected to the second terminal of the fourth capacitor by way of a sixteenth switch, a negative input terminal connected to the second terminal of the third capacitor by way of a seventeenth switch, a first output terminal connected to the negative input terminal by way of an eighteenth switch, and a second output terminal connected to the positive input terminal by way of a nineteenth switch, wherein the second operational amplifier provides the first and second analog output signals at the first and second output terminals, respectively, in the second operating phase;

a fifth capacitor having a first terminal connected to the negative input terminal of the second operational amplifier, and a second terminal connected to the first output terminal of the second operational amplifier; and a sixth capacitor having a first terminal connected to the positive input terminal of the second operational amplifier, and a second terminal connected to the second output terminal of the second operational amplifier.

17. The system of claim 16, wherein the first, second, third, fourth, and seventh switches are switched on in the first and third operating phases, and the fifth, sixth, eighth, and ninth switches are switched on in the second operating phase.

18. The system of claim 17, wherein the tenth, twelfth, thirteenth, fifteenth, eighteenth, and nineteenth switches are switched on in the first operating phase, and the eleventh, fourteenth, sixteenth, and seventeenth switches are switched on in the second operating phase.

19. The system of claim 15, wherein the ADC is connected to the PGA circuit and the ADC converts the first and second analog output signals differential around the common-mode voltage to a digital output signal.

20. The system of claim 19, wherein the first operating phase corresponds to a sampling phase of the ADC, the second operating phase corresponds to a signal amplification phase of the PGA circuit, and the third operating phase corresponds to an analog-to-digital conversion phase of the ADC.

* * * * *